US009029211B2

(12) United States Patent
Xiao

(10) Patent No.: US 9,029,211 B2
(45) Date of Patent: May 12, 2015

(54) NANO FIELD-EFFECT VACUUM TUBE AND FABRICATION METHOD THEREOF

(71) Applicant: Semiconductor Manufacturing International (Shanghai) Corporation, Shanghai (CN)

(72) Inventor: Deyuan Xiao, Shanghai (CN)

(73) Assignee: Semicoductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 14/020,965

(22) Filed: Sep. 9, 2013

(65) Prior Publication Data

US 2014/0332753 A1 Nov. 13, 2014

(30) Foreign Application Priority Data

May 9, 2013 (CN) .......................... 2013 1 0170430

(51) Int. Cl.

| | |
|---|---|
| ***H01L 21/336*** | (2006.01) |
| ***H01L 21/8234*** | (2006.01) |
| ***H01L 29/26*** | (2006.01) |
| ***H01L 29/10*** | (2006.01) |
| ***H01L 29/66*** | (2006.01) |
| ***H01L 29/78*** | (2006.01) |
| ***H01L 29/06*** | (2006.01) |
| *B82Y 40/00* | (2011.01) |

(52) U.S. Cl.

CPC ............ *H01L 29/26* (2013.01); *H01L 29/1033* (2013.01); *H01L 29/66969* (2013.01); *H01L 29/78* (2013.01); *H01L 29/0665* (2013.01); *H01L 29/66477* (2013.01); *B82Y 40/00* (2013.01)

(58) Field of Classification Search

None

See application file for complete search history.

(56) References Cited

U.S. PATENT DOCUMENTS

| | | | | |
|---|---|---|---|---|
| 6,437,360 | B1 * | 8/2002 | Cho et al. | 257/10 |
| 7,452,778 | B2 * | 11/2008 | Chen et al. | 438/283 |
| 8,679,902 | B1 * | 3/2014 | Basker et al. | 438/142 |
| 2003/0173617 | A1 * | 9/2003 | Sato et al. | 257/327 |
| 2006/0216897 | A1 * | 9/2006 | Lee et al. | 438/282 |
| 2010/0193770 | A1 * | 8/2010 | Bangsaruntip et al. | 257/24 |
| 2011/0012176 | A1 * | 1/2011 | Chidambarrao et al. | 257/255 |
| 2011/0133162 | A1 * | 6/2011 | Bangsaruntip et al. | 257/24 |
| 2011/0133169 | A1 * | 6/2011 | Bangsaruntip et al. | 257/38 |
| 2014/0151705 | A1 * | 6/2014 | Xiao et al. | 257/64 |
| 2014/0231914 | A1 * | 8/2014 | Chang et al. | 257/347 |
| 2014/0353753 | A1 * | 12/2014 | Loubet et al. | 257/347 |

* cited by examiner

*Primary Examiner* — Andres Munoz

(74) *Attorney, Agent, or Firm* — Anova Law Group, PLLC

(57) ABSTRACT

A method is provided for fabricating a nano field-effect vacuum tube. The method includes providing a substrate having an insulating layer and a sacrificial layer; and forming a sacrificial line, a source sacrificial layer and a drain sacrificial layer. The method also includes forming a trench in the insulating layer; and forming a dielectric layer on the surface of the sacrificial line. Further, the method includes forming a metal layer on the dielectric layer to fill up the trench, cover the sacrificial line and expose the source sacrificial layer and the drain sacrificial layer; and removing the source sacrificial layer and the drain sacrificial layer. Further, the method also includes removing the sacrificial line to form a through channel; forming an isolation layer on the metal layer; and forming a source region and a drain region on the insulating layer at both ends of the metal layer.

14 Claims, 9 Drawing Sheets

NANO FIELD-EFFECT VACUUM TUBE AND FABRICATION METHOD THEREOF

CROSS-REFERENCES TO RELATED APPLICATIONS

This application claims the priority of Chinese patent application No. 201310170430.3, filed on May 9, 2013, the entirety of which is incorporated herein by reference.

FIELD OF THE INVENTION

The present invention generally relates to the field of semiconductor technology and, more particularly, relates to nano field-effect vacuum tubes and fabrication techniques thereof.

BACKGROUND

Vacuum tubes may be the earliest electrical signal amplifiers. Vacuum tubes may be used to switch or to modulate electrical signals. They had been used in electronic devices such as televisions, radios, and loudspeakers, etc., for many decades. Nowadays, vacuum tubes are still used as audio power amplifiers in niche applications such as premier sound systems because of the low noise and high stability constants. Vacuum tubes may often be fabricated by mechanical machining processes and used as discrete components, and it may be not easy to integrate vacuum tubes with other devices. In contrast, semiconductor devices may be easily fabricated, and also have advantages such as low cost, low-power consumption, lightness, long lifetime, and ideal form factor for integrated circuits. Therefore, the vacuum tubes have been gradually substituted by the semiconductor devices.

In spite of that, vacuum tubes may still possess a plurality of advantages compared with semiconductor devices, such as high carrier mobility, and high output frequency, etc. Further, vacuum tubes may be more robust than semiconductor devices in extreme environments involving high temperature, and/or exposure to various radiations.

With the development of technologies, size of vacuum tubes has been reduced, and vacuum tubes have been integrated in existing integrated circuits (ICs) to enhance the performance of ICs.

FIG. 1 illustrates an existing vacuum tube. The vacuum tube includes: an emitter 11 on the surface of a substrate 10 at the bottom of the vacuum tube; a planar collector 20 at the top of the vacuum tube; and a vacuum chamber 40 between the substrate 10 and the collector 20, and vertical to the substrate 10 and the collector 20. The vacuum tube also includes a gate 30 between the substrate 10 and the collector 20. The gate 30 is parallel to the substrate 10, and surrounds the chamber 40. A partial of the gate is in the chamber 40. The gate 30 and the substrate 10 are isolated by a first isolation layer 31. The gate 30 and the collector 20 are isolated by a second isolation layer 32.

The emitter 11 may be a circular cone, and the collector 20 may be a planar electrode. Electrons emitting from the emitter 10 may reach the collector 20 through the vacuum chamber 40. Motions of the electrons in the vacuum chamber 40 may be controlled by an voltage applied on the gate 30.

However, the performance of the existing vacuum tube may be unstable, and the fabrication of the existing vacuum tube may be difficult. With the shrinkage of the device, the size of the vacuum chamber 40 may shrink correspondingly, and the difficulty for directly etching the vacuum chamber 40 may become more prominent. The disclosed methods and devices are directed to solve one or more problems set forth above and other problems.

BRIEF SUMMARY OF THE DISCLOSURE

One aspect of the present disclosure includes a method for fabricating a nano field-effect vacuum tube. The method includes providing a substrate having an insulating layer and a sacrificial layer; and forming a sacrificial line, a source sacrificial layer and a drain sacrificial layer. The method also includes forming a trench in the insulating layer; and forming a dielectric layer on the surface of the sacrificial line. Further, the method includes forming a metal layer on the dielectric layer to fill up the trench, cover the sacrificial line and expose the source sacrificial layer and the drain sacrificial layer; and removing the source sacrificial layer and the drain sacrificial layer. Further, the method also includes removing the sacrificial line to form a through channel; forming an isolation layer on the metal layer; and forming a source region and a drain region on the insulating layer at both ends of the metal layer.

Another aspect of the present disclosure includes a nano field-effect vacuum tube. The nano field-effect vacuum tube includes a semiconductor substrate, and an insulating layer on the semiconductor substrate. The nano field-effect vacuum tube also includes a through channel region with a circular cross-section view used as a vacuum channel region, and a dielectric layer surrounding through channel region. Further, the nano field-effect vacuum tube includes a source region and a drain region for sealing the through channel. Further, the nano field-effect vacuum tube also includes a metal layer used as a gate, and an isolation layer for isolating the metal layer from the source region and drain region.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

A vacuum tube fabricated by an existing technique may be difficult to integrate with existing integrated circuits (ICs), and the fabrication may be difficult as well. With the shrinkage of the vacuum tube, it may be more difficult to fabricate. Further, because a circular cone may be used as an emitter in the existing vacuum tube, the electric field near to the emitter may be relatively strong. It may be easy for electrons to escape, but the surface of the emitter may be damaged by the high energy discharge generated be the relatively strong electric field, and the performance of the vacuum tube may be reduced. A nano field-effect vacuum tube may be used to overcome such difficulties.

Figure 17:
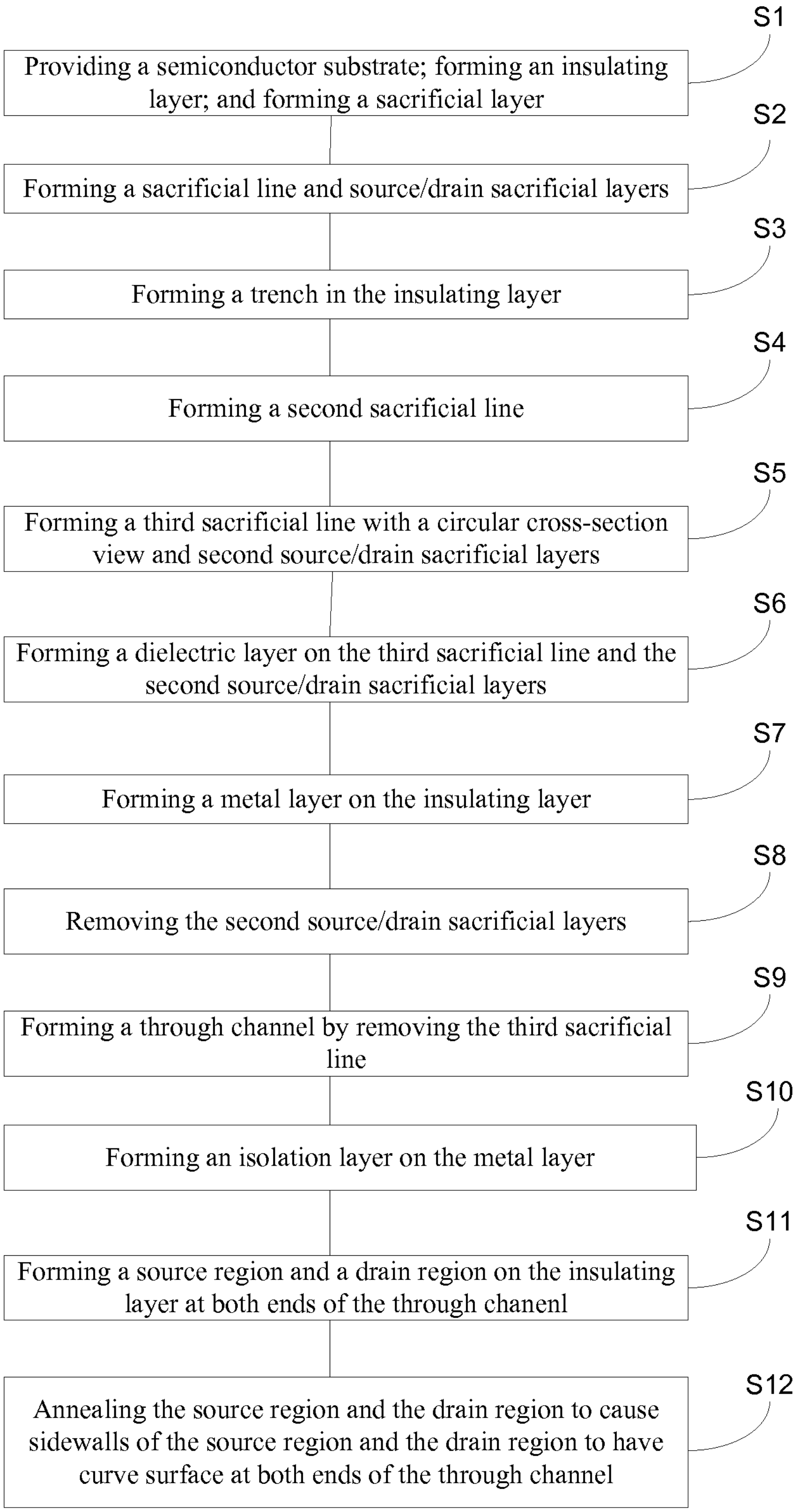
FIG. 17 illustrates an exemplary fabrication process for a nano field-effect vacuum tube consistent with the disclosed embodiments.

FIG. 17 illustrates an exemplary fabrication process for a nano field-effect vacuum tube consistent with the disclosed embodiments; and FIGS. 2-15 illustrate semiconductor structures corresponding to certain stages of the exemplary fabrication process.

Figure 1:
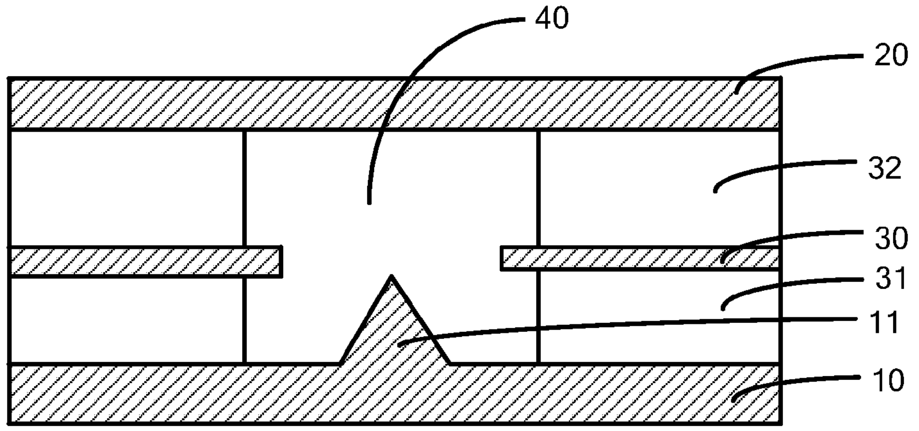
FIG. 1 illustrates an existing vacuum tube.
Figure 2:
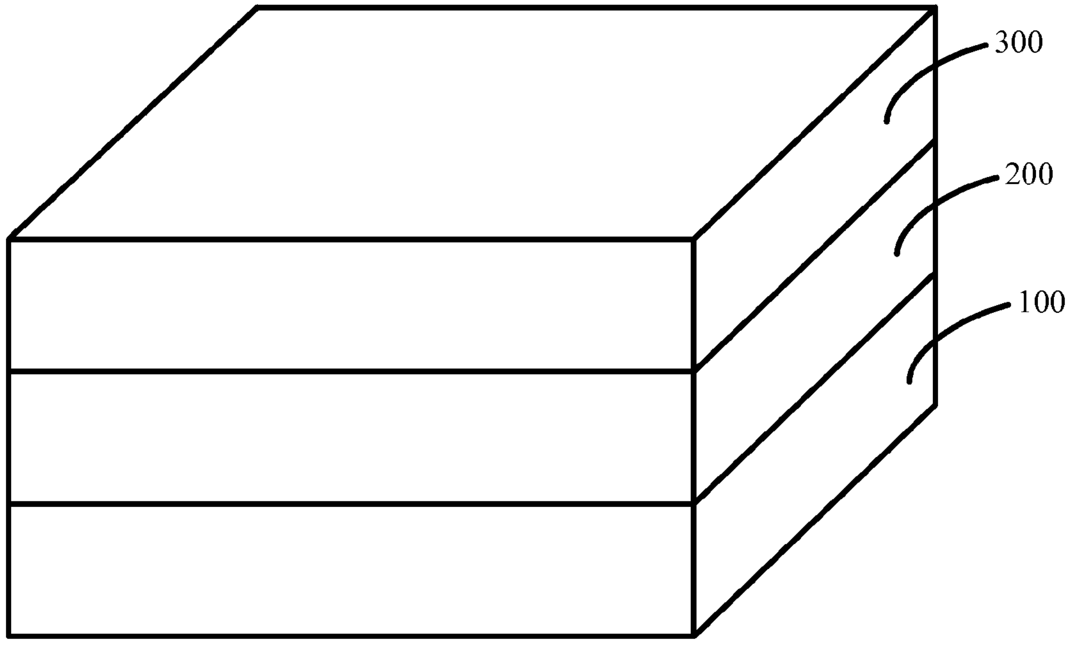
FIGS. 2-15 illustrate semiconductor structures corresponding to certain stages of an exemplary fabrication process for a nano field-effect vacuum tube consistent with the disclosed embodiments.

As shown in FIG. 17, at the beginning of the fabrication process, a semiconductor substrate with certain structures is provided (S1). FIG. 2 illustrates a corresponding semiconductor structure.

As shown in FIG. 2, a semiconductor substrate 100 is provided. The semiconductor substrate 100 may include any appropriate type of semiconductor material, such as single crystal silicon, poly silicon, amorphous silicon, silicon germanium, carborundum, indium antimonide, lead telluride, indium arsenide, indium phosphide, gallium arsenide, gallium antimonide, alloy semiconductor, epitaxially grown materials and/or silicon on insulator (SOI). The semiconductor substrate 100 may have different orientation according to subsequently formed semiconductor devices. The semiconductor substrate 100 may also provide a base for subsequent processes and structures After providing the semiconductor substrate 100, an insulating layer 200 may be formed on the semiconductor substrate 100. The insulating layer 200 may be used to isolate a subsequently formed vacuum tube and the semiconductor substrate 100. The insulating layer 200 may be made of any appropriate material, such as silicon oxide, silicon nitride, or silicon oxynitride, etc. Various methods may be used to form the insulating layer 200, such as a chemical vapor deposition (CVD) process, a physical vapor deposition (PVD) process, or an epitaxial growth process, etc.

Further, after forming the insulating layer 200, a sacrificial layer 300 may be formed on the isolation layer 200. The sacrificial layer 300 may be made of any appropriate material, such as single crystalline silicon layer, or polycrystalline silicon layer, etc. The sacrificial layer 300 may also be made of any appropriate metal material, such as Al, Cr, Mo, W, Fe, Co, Cu, Ga, In, or Ti, etc. In one embodiment, the sacrificial layer 300 is a single crystal silicon layer with a (100) crystal face. Various methods may be used to form the sacrificial layer 300, such as a chemical vapor deposition (CVD) process, a physical vapor deposition (PVD) process, or an epitaxial growth process, etc.

In certain other embodiments, the vacuum tube may be formed on a SOI substrate. The bottom silicon layer of the SOI substrate may be used as the semiconductor substrate 100; the middle buried oxide layer of the SOI substrate may be used as the insulating layer 200; and the top silicon layer of the SOI substrate may be used as the sacrificial layer 300.

Figure 3:
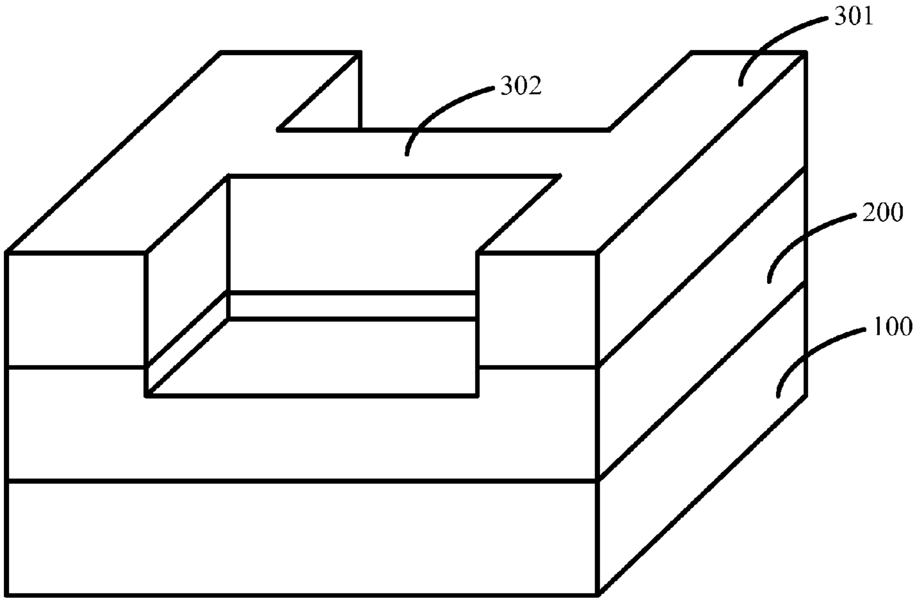

Returning to FIG. 17, after providing the substrate 100 and forming the insulating layer 200 and the sacrificial layer 300, a sacrificial line and source/drain sacrificial layers may be formed by etching the sacrificial layer 300 (S2). FIG. 3 illustrates a corresponding semiconductor structure.

As shown in FIG. 3, a sacrificial line 302 is formed by etching the sacrificial layer 300, and source/drain sacrificial layers 301 connecting with both ends of the sacrificial line 302 may also be formed by etching the sacrificial layer 300. A process for forming the sacrificial line 302 and the source/drain sacrificial layers 301 may refer as a fin patterning process.

The process for forming the sacrificial line 302 and the source/drain sacrificial layers 301 may include spin-coating a layer of photoresist on the sacrificial layer 300, and patterning the photoresist layer by an exposure process and a development process. The process for forming the sacrificial line 302 and the source/drain sacrificial layers 301 may also include etching the sacrificial layer 300 to form the sacrificial layer 302 and the source/drain sacrificial layers 301 using the patterned photoresist layer as a mask. After forming the sacrificial line 302 and the source/drain sacrificial layers 301, the photoresist layer may be removed. Various methods may be used to etch the sacrificial layer 300, such as a dry etching process including a deep reaction ion etching (DRIE) process or an ion beam etching process, or a wet chemical etching process, etc.

A length of the sacrificial line 302 may be in a range of approximately 2 nm~100 nm. A thickness of the sacrificial line 02 may be in a range of approximately 2 nm~100 nm. The sacrificial line 302 may be referred as a nanowire. A cross-section view of the sacrificial line 302 (or nanowire) may be rectangle.

In one embodiment, after forming the sacrificial line 302 and the source/drain sacrificial layers 301 connecting with both ends of the sacrificial line 302, the insulating layer 200 may be further etched using the patterned photoresist as an etching mask. A portion of the insulating layer 200 exposed by the sacrificial line 302 and the source/drain sacrificial layers 301 may be removed, which may help a subsequent process for suspending the sacrificial line 302.

Figure 4:
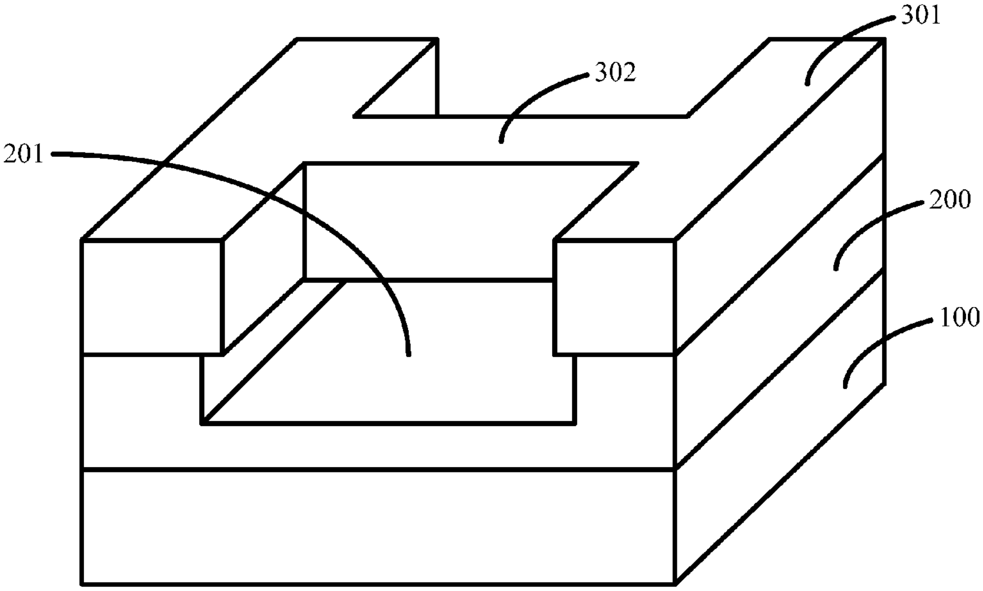

Returning to FIG. 17, after forming the sacrificial line 302 and the source/drain sacrificial layers 301, a trench may be formed in the insulating layer 200 (S3). FIG. 4 illustrates a corresponding semiconductor structure.

As shown in FIG. 4, a trench 201 is formed in the insulating layer 200 under the sacrificial line 302. The trench 201 may cause the sacrificial line 302 to be suspended.

The trench 201 may be formed by any appropriate process, such as a dry etching process, or a wet etching process. In one embodiment, the trench 201 is formed by a wet etching process. Various etchants may be used for the wet etching process.

In one embodiment, a buffered oxide etchant (BOE) solution may be used to etch the insulating layer 200 to form the trench 201. The BOE solution may be a mixture of $NH_4F$ and HF. A volume ratio of $NH_4F$ and HF may be approximately 6:1. An etching time of the BOE solution for etching the insulating layer 200 may be in a range of approximately 5 s~20 s.

In certain other embodiments, an etchant having a high etching selectivity for silicon oxide may also be used to etch the insulating layer 200 if the isolation layer is silicon oxide, such as diluted HF (DHF) solution, etc. The DHF solution may be a mixture of HF and $H_2O$. A volume ratio of HF and $H_2O$ may be in a range of approximately 1:100~1:500. An etching time may be in a range of approximately 10 s~100 s.

Referring to FIG. 3, after forming the sacrificial line 302, a portion of the insulating layer 200 exposed by the sacrificial line 302 and the source/drain sacrificial layers 301 may be removed, thus the surface of the isolation layer under the sacrificial layer 302 may be higher than the surface of the isolation layer 300 after the etching process. When a wet etching process is used to etch the insulating layer 200, a portion of the insulating layer 200 without being covered by the sacrificial line 301 and the source/drain sacrificial layers 301 may be etched in both vertical and lateral direction simultaneously. A portion of the insulating layer 200 under the sacrificial line 302 may be removed, and the trench 201 may be formed. Thus, the sacrificial line 302 may be suspended. A depth of the trench 201 may be in a range of approximately 5 nm~100 nm. A portion of the insulating layer 200 under the source/drain sacrificial layers 301 may also be etched, thus a width of the trench 201 may be greater than the length of the sacrificial line 302.

In certain other embodiments, the trench 201 may be formed by a wet etching process directly without removing the portion of the insulating layer 200 exposed by the sacrificial line 302 and the source/drain sacrificial layers 301.

Figure 5:
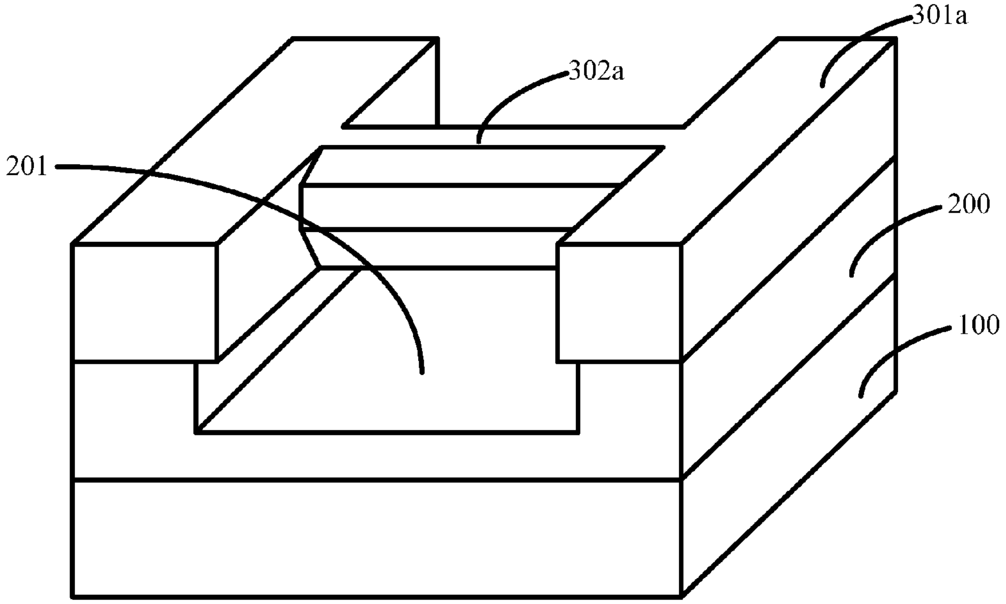

Returning to FIG. 17, after forming the trench 201, an epitaxial growth process may be performed onto the sacrificial layer 302 and the source/drain sacrificial layers 301 (S4). FIG. 5 illustrates a corresponding semiconductor structure.

As shown in FIG. 5, after the epitaxial growth process, the sacrificial line 302 with the rectangular cross-section may be turned into a second sacrificial wire 302*a* with an octagonal cross-section view. Various materials may be used for the epitaxial growth, such as silicon, or silicon germanium, etc. In one embodiment, the sacrificial layer 300 (or the sacrificial wire 302) is made of silicon with a (100) crystal face. The size of the sacrificial wire 302 may be relatively small, after the epitaxial growth process, an epitaxial layer may grow on the surface of the sacrificial wire 302 following the crystal lattices. Since grow rates on different crystal lattices may be different, the obtained second sacrificial line 302*a* may have an octagonal cross-section view. The surface area of the source/drain sacrificial layer 301 may be relatively large, thus a smooth epitaxial layer may be obtained, and the morphology of the source/drain sacrificial layer 301 may be same after the epitaxial growth process.

In certain other embodiments, a plurality of epitaxial growth processes may be performed onto the sacrificial line 302, the obtained second sacrificial line 302*a* may have a polygonal cross-section view with 16 sides, 32 sides, 64 sides, etc.

In certain other embodiments, the second sacrificial line 302*a* with a polygonal cross-section view may be formed by directly etching the sacrificial line 302 using any appropriate etching processes.

Compared with the rectangular cross-section of the sacrificial line 302, vertex angle of the cross-section of the second sacrificial line 302 be greater than 90°, which may reduce the surface electric field. Thus, the electric field of the vacuum channel region of a subsequently formed nano field-effect vacuum tube may be more uniform.

Figure 6:
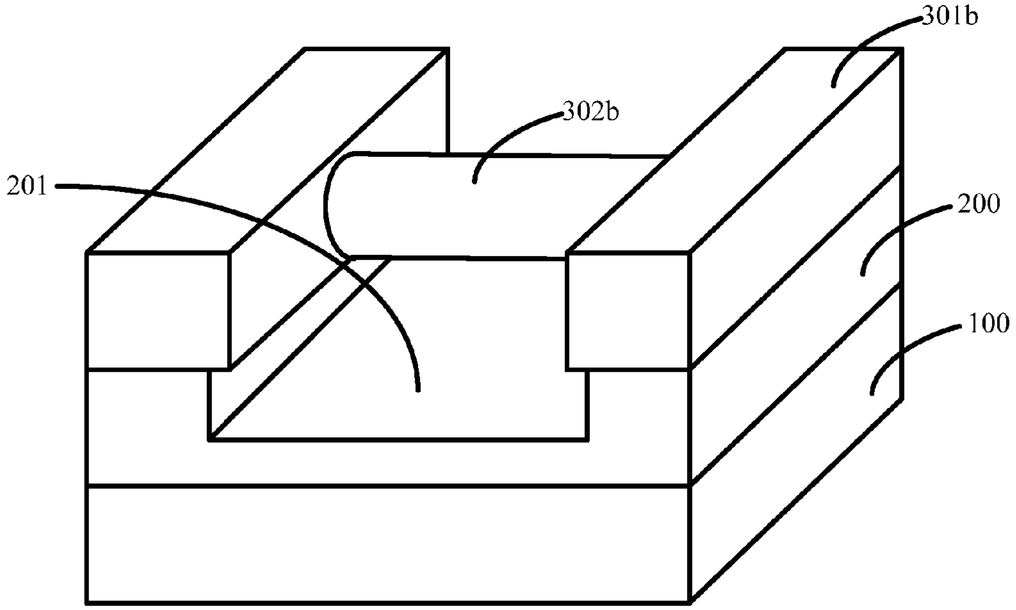

Returning to FIG. 17, after turning the sacrificial line 302 to the second sacrificial line 302*a*, a third sacrificial line 302*b* with a circular cross-section view and second source/drain sacrificial layers 301*b* may be formed (S5). FIG. 6 illustrates a corresponding semiconductor structure.

As shown in FIG. 6, a third sacrificial line 302*b* is formed and second source/drain sacrificial layers 301*b* are formed too. Various methods and processes may be used to form the third sacrificial line 302*b*. In one embodiment, the third sacrificial line 302*b* is formed by repeating an annealing process, an oxidization process, and an etching process for a plurality of time on the second sacrificial line 302*a*. The vertex angles of the second sacrificial lines 302*a* may be smoothed, and the third sacrificial line 302*b* may be formed.

The annealing process may be performed in a $H_2$, $N_2$ or He gas environment. Other appropriate gas may also be used. An annealing temperature may be in a range of approximately 800° C.~1000° C. An annealing time may be in a range of approximately 1 min~120 mins. The annealing process may further cause surface atoms of the second sacrificial lines 302*a* to rearrange, and release extra surface energy. The surface atoms may arrange with a low energy mode, and the surface of the vertex angles may become larger, and the vertex angles may become smoother.

The oxidation process may be a thermal oxidation process, a plasma oxidation process, or a chemical oxidation process, etc. An oxide layer may be formed on the surface of the second sacrificial line 302*a* after the oxidation process.

The etching process may be a dry etching process or a wet etching process, etc. In one embodiment, the etching process is wet etching process using a diluted HF solution.

The oxide layer may be removed by the etching process. Since a thickness of the oxide layer at the vertex angle may be greater than other part, the vertex angle may be removed after the etching process.

The annealing process, the oxidation process, and the etching process may be repeated for one time to three times, the surface of second sacrificial line 302*a* may be smoothed, and the third sacrificial line 302*b* with a circular cross-section view may be formed. A diameter of the third sacrificial line 302*b* may be in a range of approximately 2 nm~100 nm. A subsequently formed channel region with the circular cross-section view of a nano field-effect vacuum tube may have a more uniformed electric field distribution, thus the performance of the vacuum tube may be enhanced.

The epitaxial growth process for growing the second sacrificial line 302*a* and the annealing process may reduce times of the oxidation process and the etching process, the efficiency for forming the third sacrificial line 302*b* with the circular cross-section view may be improved.

In certain other embodiments, the third sacrificial line 302*b* with the circular cross-section view may be formed by directly oxidizing and etching the sacrificial line 302.

In certain other embodiments, the third sacrificial line 302*b* may have an elliptical cross-section view after the etching process.

Since the size of the second sacrificial line 302*a* may be relatively small, and may be suspended, the possibility for contacting with oxygen may be greater than the second source/drain sacrificial layers 301*b* during the oxidation process, a thickness of the oxide layer formed on the first sacrificial line 302*a* may be greater than a thickness of the oxide layer formed on the source/drain sacrificial layers 301*a*. Thus, as shown in FIG. 6, the surface of the third sacrificial line 302*b* may be lower than the second source/drain sacrificial layer 301*b* after the oxidation process and the etching process.

In certain other embodiments, the sacrificial line 302 may be made of Al, Cr, Mo, W, Fe, Co, Cu, Ga, In, or Ti, etc, the second sacrificial line 302*b* may be formed by directly annealing the sacrificial line 302 to cause its cross-section to change from a rectangle to a circle. The electric field distribution of the channel region of a subsequently formed vacuum tube may be more uniform, and the performance of the vacuum tube may be enhanced.

An annealing temperature may be in a range of approximately 800° C.~1200° C. An annealing time may be in a range of approximately 1 min~120 mins. The annealing process may cause a crystal lattice change of the sacrificial line 302, and crystal defects to be reduced. Atoms on the surface of the sacrificial line 302 may rearrange under the stress (or surface tension) with a low energy mode. Extra surface energy of the sacrificial line 302 may be released, and the cross-section of the sacrificial line 302 may change from a rectangle to a circle, then the third sacrificial line 302*b* with the circular cross-section may be formed.

Returning to FIG. 17, after forming the third sacrificial line 302*b*, a dielectric layer may be formed on surfaces of the third sacrificial line 302*b* and the second source/drain sacrificial layers 301*b* (S6). FIG. 6 illustrates a corresponding semiconductor structure.

Figure 7:
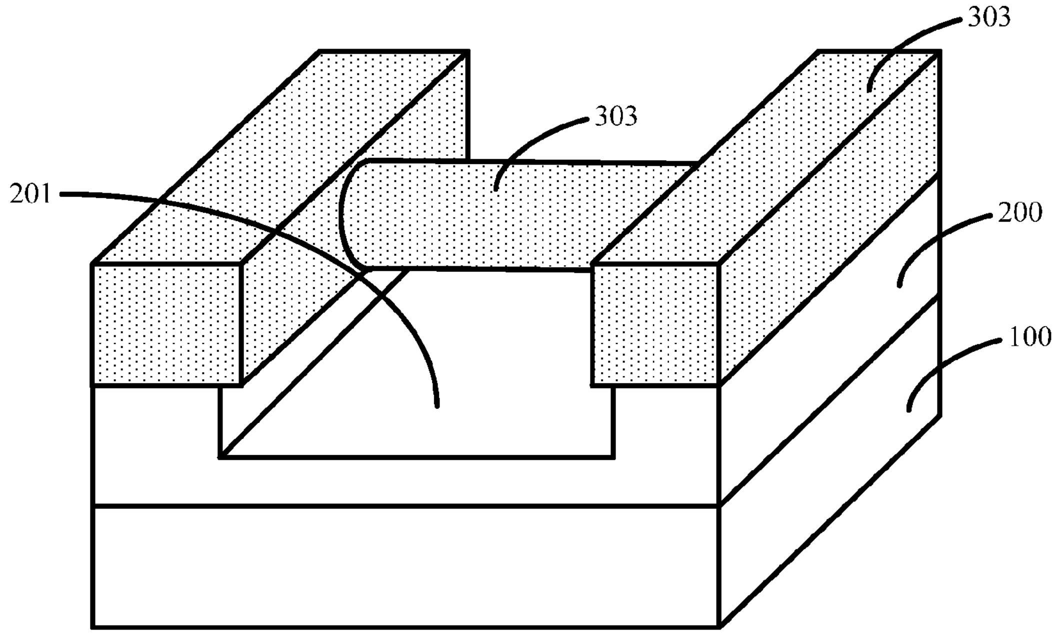

As shown in FIG. 7, a dielectric layer 303 is formed on the third sacrificial line 302*b* and the second source/drain sacrificial layers 301*b*. The dielectric layer 303 may be formed by any appropriate process, such as a CVD process, a PVD process, or an oxidation process, etc. In one embodiment, the dielectric layer 303 is formed by an oxidation process. The dielectric layer 303 made of silicon oxide may be formed on the second source/drain sacrificial layers 301*b* and the third sacrificial line 302*b*. The oxidation process may include a wet oxidation process, or a dry oxidation process, etc. In certain other embodiments, a nitrogen treatment process may also be used to form the dielectric layer 303 made of silicon oxynitride.

In certain other embodiments, if the third sacrificial line 302*b* and the second source/drain sacrificial layers 301*b* are made of a metal material, such as Al, Cr, Mo, W, Fe, Co, Cu, Ga, In, or Ti, etc., a plasma treatment process may be used to form a metal oxide layer or metal nitride layer on the surface of the third sacrificial line 302*b* and the second source/drain sacrificial layers 301*b* using $O_2$ or $N_2O$ as a plasma gas source. For example, if the third sacrificial line 302*b* and the second source/drain sacrificial layers 301*b* are made of Al, an $Al_2O_3$ layer may be formed on surface of the third sacrificial line 302*b* and the second source/drain sacrificial layers 301*b* by an $O_2$ plasma treatment. Or an AlN layer may be formed on the surface of the third sacrificial line 302*b* and the second source/drain sacrificial layers 301*b* by a $NH_3$ plasma treatment. The $Al_2O_3$ layer and the AlN layer may be used as the dielectric layer 303. The $Al_2O_3$ layer and the AlN layer may also be formed by an atomic layer deposition (ALD) process.

Referring to FIGS. 6-7, the dielectric layer 303 on the third sacrificial line 302*b* may be used as a gate dielectric layer of a subsequently formed vacuum tube.

Figure 8:
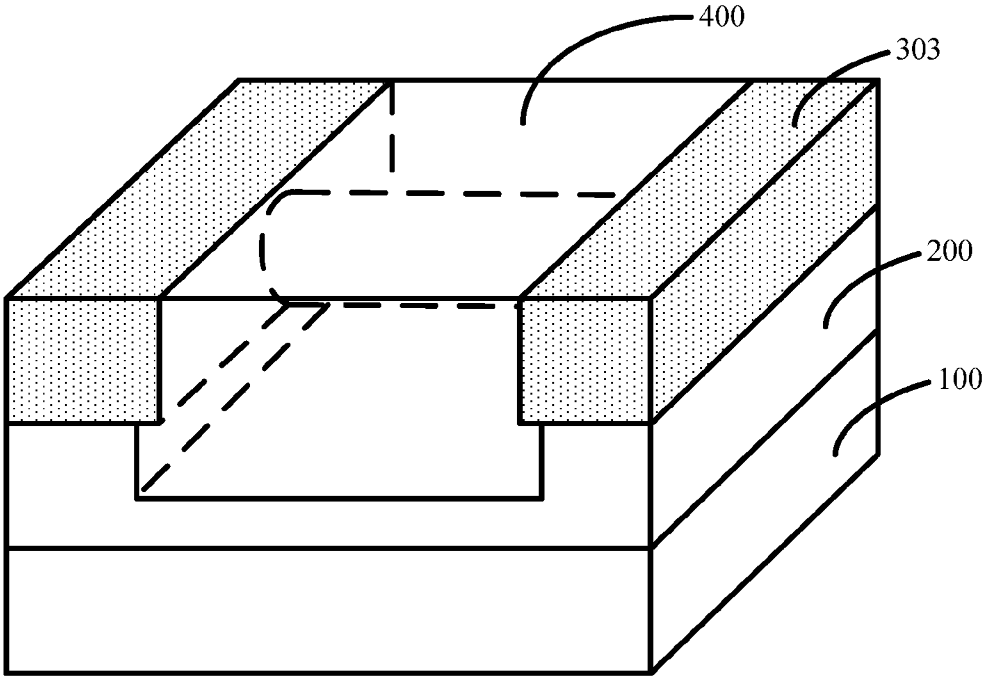

Returning to FIG. 17, after forming the dielectric layer 303, a metal layer may be formed on the insulating layer 200 (S7). FIG. 8 illustrates a corresponding semiconductor structure.

As shown in FIG. 8, a metal layer 400 is formed on the surface of the insulating layer 200. The metal layer 400 may fill up the trench 201, and cover surfaces of the third sacrificial line 302*b* and the dielectric layer 303. The metal layer 400 may expose the second source/drain sacrificial layer 301*b* and the dielectric layer 303 on the second source/drain sacrificial layer 301*b*. The metal layer 400 may be used as a gate of a subsequently formed nano field-effect vacuum tube.

The metal layer 400 may be formed by depositing a metal material in the trench 201 to fill up the trench 201 and cover the dielectric layer 303; and polishing the metal material using the dielectric layer 303 as a polishing stop layer until surface of the metal layer 400 levels with the surface of the dielectric layer 303. In certain other embodiments, a mask layer with openings corresponding to the second source/drain sacrificial layers 302*b* may be formed on the metal layer 400 after depositing the metal layer 400, then the metal layer 400 may be etched along the openings to remove the metal material on the second source/drain sacrificial layers 301*b*, thus the surface of the second source/drain sacrificial layers 301*b* may be exposed. The surface of the metal layer 400 may be higher than the surface of the second source/drain sacrificial layers 301*b*.

A process for depositing the metal layer 400 may be a CVD process, a metal organic CVD (MOCVD) process or an ALD process, etc. The metal layer 400 may be made of one or more of Al, Cu, Ag, Au, Pt, Ni, Ti, TiN, Ta, TaC, TaSiN, W, WN, and WSi, etc.

Figure 9:
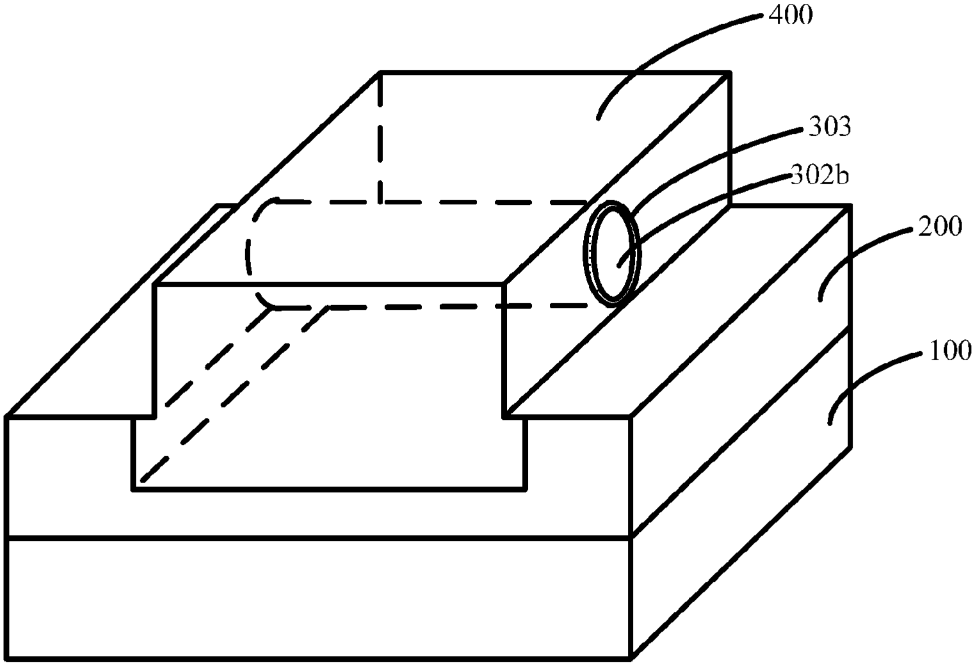

Returning to FIG. 17, after forming the metal layer 400, the second source/drain sacrificial layer 301*b* may be removed (S8). FIG. 9 illustrates a corresponding semiconductor structure.

As shown in FIG. 9, the second source/drain sacrificial layers 302*b* are removed. The dielectric layer 303 on the second source/drain sacrificial layers 302*b* may also be removed. A portion of the sidewalls of the metal layer 400 may be exposed. The sidewalls of both ends of the third sacrificial line 302*b* and the dielectric layer 303 on the third sacrificial line 302*b* may also be exposed.

Various methods may be used to remove the second source/drain sacrificial layers 302*b* and the dielectric layer 303 on the second source/drain sacrificial layers 302*b*, such as a dry etching process, or a wet etching process, etc. In one embodiment, a dry etching process is used to remove the second source/drain sacrificial layers 302*b* and the dielectric layer 303 on the second source/drain sacrificial layers 302*b* using the insulating layer 200 as an etching stop layer.

Figure 10:
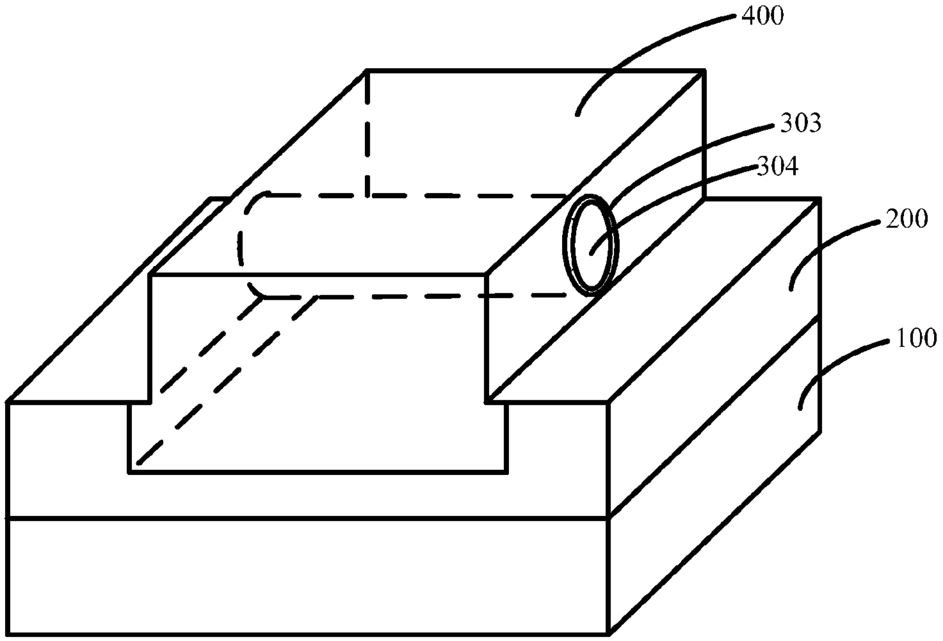

Returning to FIG. 17, after removing the second source/drain sacrificial layers 302*b* and the dielectric layer 303 on the second source/drain sacrificial layers 302*b*, a through channel may be formed by removing the third sacrificial line 302*b* (S9). FIG. 10 illustrates a corresponding semiconductor structure.

As shown in FIG. 10, a through channel 304 is formed by removing the third sacrificial line 302*b*. The third sacrificial line 302*b* may be removed by any approximately process, such as a dry etching process, or a wet etching process, etc. In one embodiment, the third sacrificial line 302*b* is removed by a wet etching process. The wet etching process may etch the third sacrificial line 302*b* from both the exposed ends.

Any appropriate enchant with a high etching selectivity to the third sacrificial line 302*b* may be used. In one embodiment, the third sacrificial line 302*b* is made of silicon, a NaOH solution or a KOH solution may be used as the etchant to remove the third sacrificial line 302*b*. In certain other embodiments, the third sacrificial line 302*b* is made of Al, a mixture solution of phosphoric acid, acetic acid and nitric acid may be used as an etchant to selectively etch and remove Al.

Referring to FIGS. 9-10, after removing the third sacrificial line 302*b*, the through (hollow) channel 304 may formed in the metal layer 400. The through channel 304 may be used a vacuum channel region of a subsequently formed nano vacuum tube.

Figure 11:
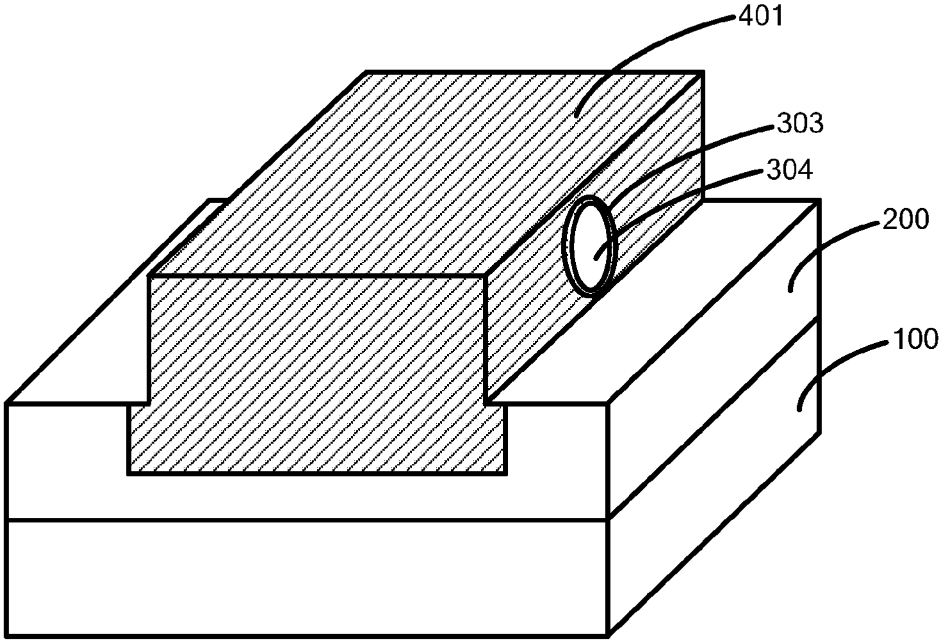

Returning to FIG. 17, after forming the through channel 304, an isolation layer may be formed on the metal layer 400 (S10). FIG. 11 illustrates a corresponding semiconductor structure.

As shown in FIG. 11, an isolation layer 401 is formed on the metal layer 400. The isolation layer 401 may be used as an isolation structure between subsequently formed source region and drain region.

The isolation layer 401 may be made of any appropriate material, such as silicon oxide, silicon nitride, or silicon oxynitride, etc. Various methods may be used to form the isolation layer 401, such as an in situ plasma treatment process, a CVD process, a PVD process, or an ALD process, etc. In one embodiment, the isolation layer 401 may be formed by an oxygen plasma treatment process or a nitrogen plasma treatment process onto the surface of the metal layer 400. Oxygen may be used in the oxygen plasma treatment process to form the isolation layer 401. $N_2O$ and the $NH_3$ may be used in the nitrogen plasma treatment process to form the isolation layer 401. In certain other embodiments, an ALD process may be used to deposit an $Al_2O_3$ layer or an AlN layer on the metal layer 400 to form the isolation layer 401.

Figure 12:
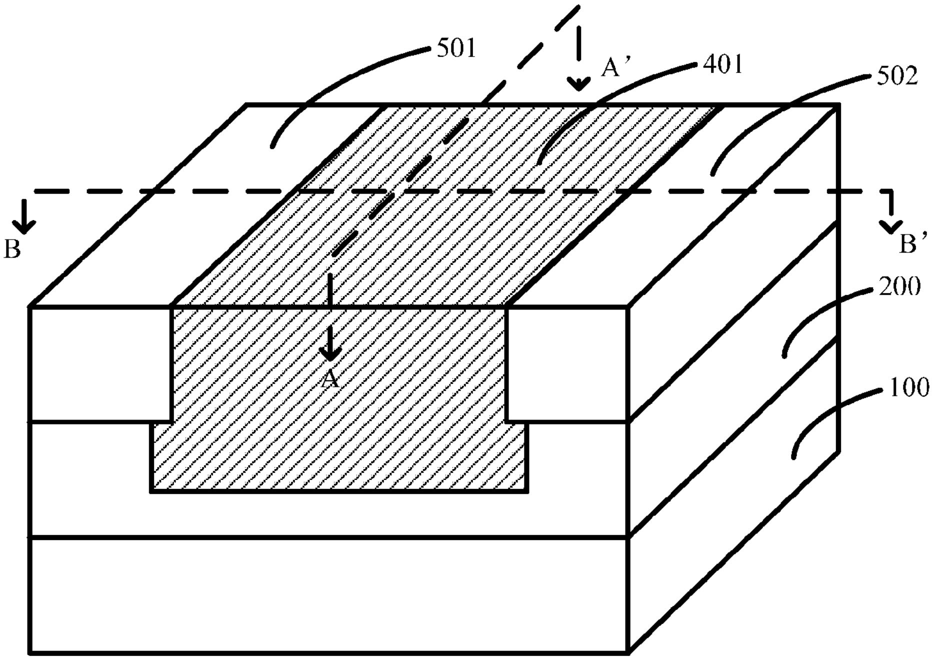

Returning to FIG. 17, after forming the isolation layer 401, a source region and a drain region may be formed (S11). FIG. 12 illustrates a corresponding semiconductor structure.

As shown in FIG. 12, a source region 501 and a drain region 502 are formed on the surface of the insulating layer 200 at both ends of the metal layer 400. The source region 501 and the drain region 502 may seal the through channel 304.

The source region 501 and the drain region 502 may be made of one or more of Zr, V, Nb, Ta, Cr, Mo, W, Fe, Co, Pd, Cu, Al, Ga, In, Ti, TiN, TaN, and diamond, etc. A material of the source region 501 and the drain region 502 may have an electron affinity approximately smaller than 100 KJ·mol/L. The electron affinity may refer to the energy for losing electrons. The electron affinity of the material of the source region 501 and the drain region 502 may be relatively low, it may be easy for electrons to escape from the surface of the source region 501 and the drain region 502 to become carriers. Thus, an obtained nano field-effect vacuum tube may have a relatively low threshold voltage.

Various methods may be used to form the source region 501 and the drain region 502, such as a CVD process, or a PVD process, etc. A chamber pressure of the CVD process or the PVD process may be in a range of approximately 0.1 Torr~50 Torr. The through channel 304 may be sealed after forming the source region 501 and the drain region 502. A pressure inside the through channel 304 may be same as the chamber pressure of the CVD process or the PVD process, which is in a range of approximately 0.1 Torr~50 Torr. Since the length of the though channel 304 may be in a range of approximately 2 nm~100 nm, the diameter of the through channel 304 is a range of approximately of 2 nm~100 nm, the size of the through channel 304 is relatively small, and may be smaller than the average free path of electron in air. Therefore, even the through channel may impossibly be completely vacuum, the scattering effect of electrons may be still substantially small, and the electrons in the through channel 304 may have a relatively high carrier mobility. The through channel 304 may be used as the channel region of a subsequently formed nano field-effect vacuum tube, and electrons escaping from the source region 501 may reach the drain region 502 through the channel region (the through channel 304). Since pressure in the through channel region 304 may be relatively low, and may be near to vacuum, the electrons may unlikely be affected by crystal lattices of semiconductor materials, the electron carrier mobility in the through channel 304 near to vacuum may be significantly faster than in semiconductor materials.

Figure 13:
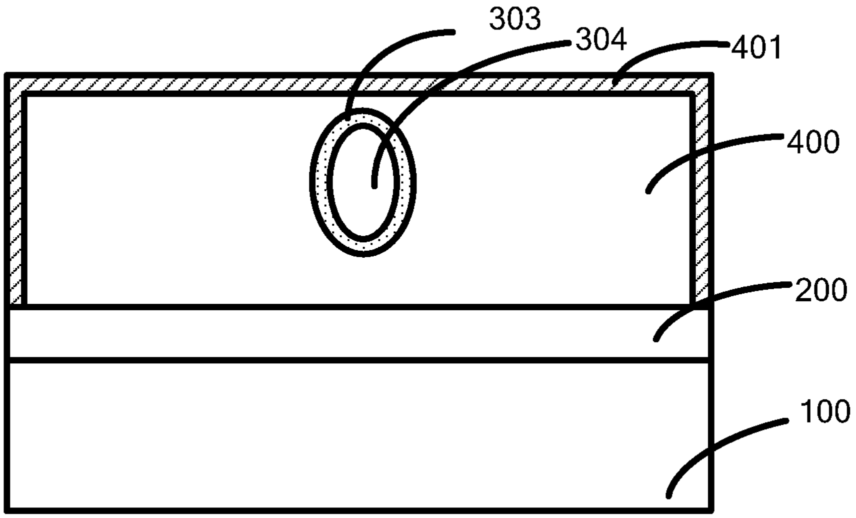

FIG. 13 illustrates a cross-section view of FIG. 12 along the AA' direction. As shown in FIG. 13, the inner surface of the through channel 304 may have a uniform layer of dielectric layer 303. The dielectric layer 303 may be used as a gate dielectric layer of the nano field-effect vacuum tube. The through channel 304 may be the channel region of the nano field-effect vacuum tube. The metal layer 400 may surround the dielectric layer 303 and the through channel 304.

Figure 14:
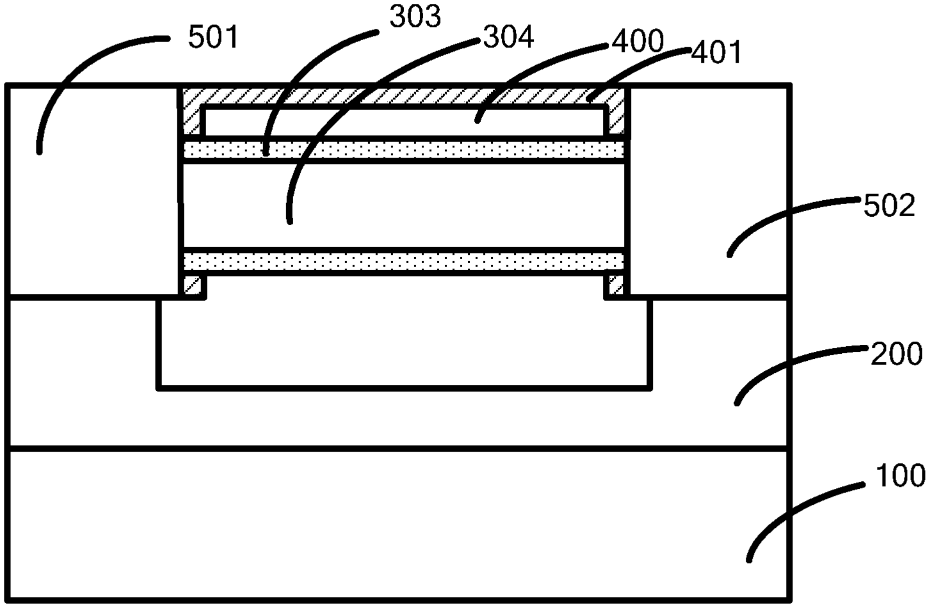
Figure 15:
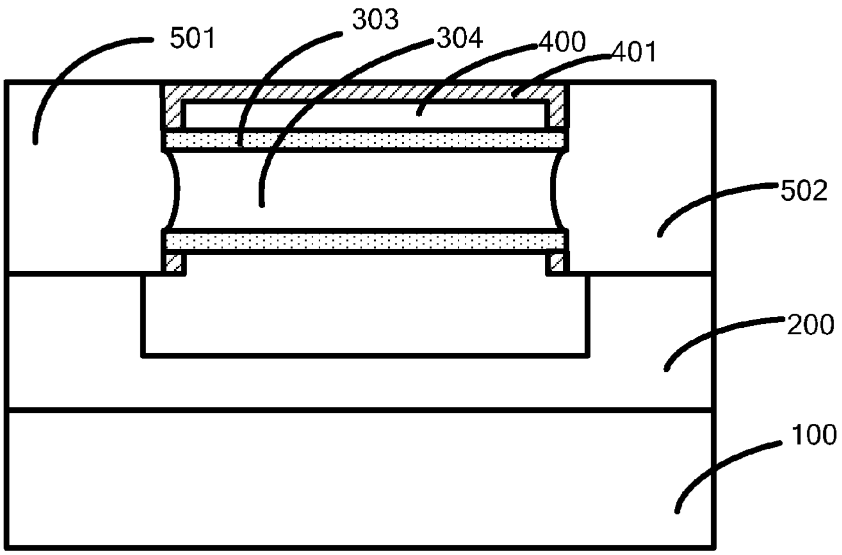

FIG. 14 illustrates a cross-section view of FIG. 12 along the BB' direction. As shown in FIG. 15, the metal layer 400 and the source region 501 may be isolated by the isolation layer 401, and the metal layer 400 and the drain region 502 may be also be isolated by the isolation layer 401. Further, the through channel 304 may be sealed by the source region 501 and the drain region 502.

Referring FIGS. 13-14, the through channel 304 may be surrounded by the dielectric layer 303 and the metal layer 400, the thickness of the dielectric layer 303 may be uniform, thus when a gate voltage is applied on the metal layer 400, an electric field in the through channel 304 may also be uniform. When the vacuum tube is turned on, an uniform and symmetric electric field may be formed. The symmetric electric filed may prevent the electron from distracting the direction and passing through the dielectric layer 303 to form a leaking current.

Returning to FIG. 17, after forming the source region 501 and the drain region 502, a thermal annealing process may be performed to make the sidewalls of the source region 501 and the drain region 502 to have curve surfaces (S12). FIG. 15 illustrates a corresponding semiconductor structure.

As shown in FIG. 15, the sidewalls of the source region 501 and the drain region 502 at both ends of the through channel region 304 become curve surfaces. The curves surfaces may be formed by a thermal annealing process.

The thermal annealing process may performed in any appropriate gas environment, such as a $N_2$ environment, or $H_2$ environment, etc. An annealing temperature may be in a range of approximately 600° C.~1000° C. An annealing time may be in a range of approximately 0.1 min~100 mins. During the annealing process, the surface energy of the source region 501 and the drain region 502 may reduce, surface atoms may rearrange with a low energy mode under a stress, the surface of the source region 501 and the surface of the drain region 502 at both ends of the through channel 304 may be turned into curve surfaces. Other parts of the source region 501 and the drain region 502 may stay same because of their large area.

Since the surface of the source region 501 and the surface of the drain region 502 are curved shapes, the curvature of the surface of the source region 501 and the surface of the drain region 502 may be increased. After applying a source/drain voltage between the source region 501 and the drain region 502, an electric field near to the surface of the source region 501 and the drain region 502 may be increased, it may be easier for electrons to escape. Thus, the threshold voltage of the nano field-effect vacuum tube may be reduced. However, the curvature of the curve shape may be relatively small, and density of the electric lines may be unable to generate enough energy to form discharge which may destroy the surfaces of the source region 501 and the drain region 502. Thus, the performance of the nano field-effect vacuum tube may be relatively stable.

Figure 16:
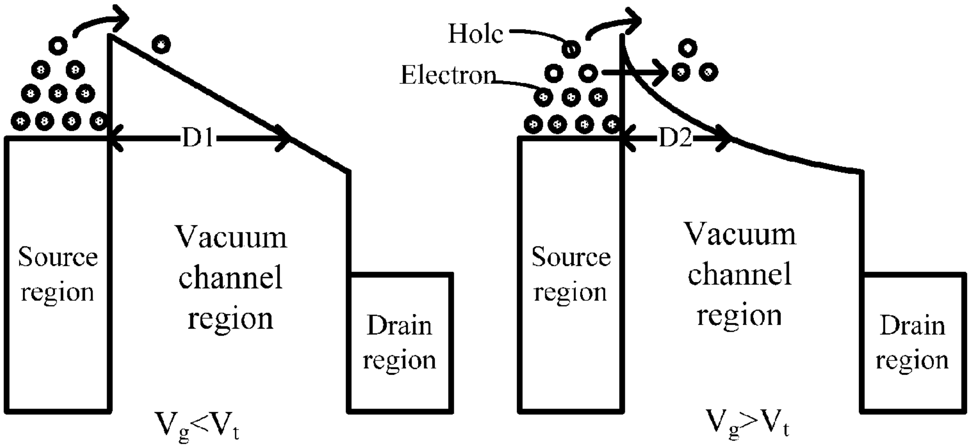
FIG. 16 illustrates the energy band of a nano field-effect vacuum tube consistent with the disclosed embodiments.

FIG. 16 illustrates a band gap structure of the nano field-effect vacuum tube after a gate voltage $V_g$ is applied. The principle of the nano field effect vacuum tube is based on a tunneling effect.

When the gate voltage $V_g$ is smaller than a threshold voltage $V_t$ of the nano field-effect vacuum tube, the nano field-effect vacuum tube may be at an "off" state. The potential barrier of the surface of a source region may be relatively high, a tunneling distance D1 for electrons to tunnel into a vacuum channel region may be relatively large, it may be difficult for the electrons to tunnel into the channel region. It may only have a relatively small amount of electrons on the surface of the source region to enter into the channel region because the small amount of electrons may overcome the potential barrier of the surface of the source region by thermal movements. The number of the electrons entering into the channel region by a thermal transition may be substantially small. Thus, a leakage current of the nano field-effect transistor may be substantially small as well, and the nano field-effect vacuum tube may be at the "off" state.

When the gate voltage $V_g$ is greater than the threshold voltage $V_t$ of the nano field-effect vacuum tube, an energy level of the vacuum channel region may bend downwardly, which may cause a tunneling distance $D_2$ for electrons of the surface of the source region entering into the vacuum channel region to be reduced. Thus, a significantly large amount of electrons of the surface of the source region may tunnel into the vacuum channel region by the tunneling effect. Carriers may be formed, and the nano field-effect vacuum tube may be turned on.

A stronger electric field on the surface of the source region may cause the energy level of the vacuum channel region to bend more downwardly, and the tunneling distance may be shorter. In one embodiment, the surface of the source region may be a curve shape, the electric field on the surface of the source region may be increased. Thus, the threshold voltage may be reduced, and the power may be lowered.

The method for forming nano field-effect vacuum tubes may be compatible with existing methods for forming metal oxide field-effect vacuum tubes. Further, the nano field effect vacuum tube may be a planar structure, and it may be easy to integrate with existing integrated circuits.

Thus, a nano field-effect vacuum tube may be formed by the above disclosed processes and methods. The corresponding nano field-effect vacuum tube is illustrated in FIG. 15. The nano field-effect vacuum tube includes a semiconductor substrate 100, and an insulating layer 200. The nano field-effect vacuum tube also includes a through channel region 304 with a circular cross-section view used for a vacuum channel region, and a dielectric layer 303 surrounding the through channel region 304. Further, the nano field-effect vacuum tube includes a source region 501 and a drain region 502 for sealing the through channel 304. Further, the nano field-effect vacuum tube also includes a metal layer 400 used as a gate, and an isolation layer 401 for isolating the metal layer 400 from the source region 501 and drain region 502. The detailed structures and intermediate structures are described above with respect to the fabrication methods.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a nano field-effect vacuum tube, comprising:

providing a semiconductor substrate having an insulating layer and a sacrificial layer;

forming a sacrificial line and source/drain sacrificial layers connecting with the sacrificial line;

forming a trench in the insulating layer to suspend the sacrificial line;

forming a dielectric layer on a surface of the sacrificial line;

forming a metal layer on the dielectric layer to fill up the trench, cover the sacrificial line and expose the source/drain sacrificial layers;

removing the source/drain sacrificial layers to expose opposite ends of the sacrificial line and the dielectric layer;

removing the sacrificial line to form a through channel;

forming an isolation layer on the metal layer; and forming a source region and a drain region on the insulating layer at opposite ends of the metal layer to seal the through channel to form the nano field-effect vacuum tube.

2. The method according to claim 1, wherein forming the sacrificial line further includes:

forming a second sacrificial line with an octagonal cross-section view; and forming a third sacrificial line with a circular cross-section view.

3. The method according to claim 2, wherein:

the second sacrificial line is formed by an epitaxial growth process.

4. The method according to claim 2, wherein forming the third sacrificial line further includes:

annealing the second sacrificial line;

forming an oxide layer on a surface of the second sacrificial line; and removing the oxide layer.

5. The method according to claim 2, wherein forming the third sacrificial line further includes:

annealing the second sacrificial line.

6. The method according to claim 5, wherein:

an annealing temperature is in a range of approximately 800° C.-1200° C.; and annealing time is in range of approximately 1 min-120 mins.

7. The method according to claim 1, after forming the source region and the drain region, further including:

annealing the source region and the drain region to cause sides of the source region and the drain region at opposite ends of the through channel to have curved surfaces.

8. The method according to claim 7, wherein:

an annealing environment is $H_2$, or $N_2$;

an annealing temperature is in a range of approximately 600° C.-1000° C.; and an annealing time is in a range of approximately 0.1 min-100 mins.

9. The method according to claim 1, wherein:

a length of the through channel is in a range of approximately 2 nm-100 nm; and a diameter of the through channel is in a range of approximately 2 nm-100 nm.

10. The method according to claim 1, wherein:

the sacrificial layer is made of Si, Al, Cr, Mo, W, Fe, Co, Cu, Ga, In, or Ti.

11. The method according to claim 1, wherein:

a cross-section view of the sacrificial line is rectangular, octagonal or circular.

12. The method according to claim 1, wherein:

the insulating layer is made of silicon oxide, or silicon oxynitride.

13. The method according to claim 1, wherein:

the isolation layer is made of aluminum oxide, or aluminum nitride.

14. The method according to claim 1, wherein:

a pressure of the through channel is in a range of approximately 0.1 Torr-50 Torr.

* * * * *